United States Patent
Hsu et al.

(10) Patent No.: US 8,366,496 B2
(45) Date of Patent: Feb. 5, 2013

(54) COMPOSITE CONTACT ASSEMBLY HAVING LOWER CONTACT WITH CONTACT ENGAGING POINTS OFFSET FROM EACH OTHER

(75) Inventors: Hsiu-Yuan Hsu, New Taipei (TW); Chun-Fu Lin, New Taipei (TW); Shih-Wei Hsiao, New Taipei (TW); Ke-Hao Chen, New Taipei (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 105 days.

(21) Appl. No.: 13/046,794

(22) Filed: Mar. 14, 2011

(65) Prior Publication Data
US 2011/0230105 A1    Sep. 22, 2011

(30) Foreign Application Priority Data
Mar. 18, 2010 (TW) .................................. 099204717

(51) Int. Cl.
*H01R 13/24* (2006.01)
(52) U.S. Cl. .......................................... 439/824; 439/66
(58) Field of Classification Search .................. 439/66, 439/700, 824
See application file for complete search history.

(56) References Cited

U.S. PATENT DOCUMENTS

| 7,025,602 B1 * | 4/2006 | Hwang | 439/66 |
| 7,256,593 B2 * | 8/2007 | Treibergs | 324/754.05 |
| 7,285,026 B1 * | 10/2007 | Ju | 439/700 |
| 7,467,952 B2 * | 12/2008 | Hsiao et al. | 439/66 |

* cited by examiner

*Primary Examiner* — Tulsidas C Patel
*Assistant Examiner* — Travis Chambers
(74) *Attorney, Agent, or Firm* — Wei Te Chung; Ming Chieh Chang

(57) ABSTRACT

An electrical contact assembly electrical contact assembly comprises upper contact having a lower mating end at a lower end thereof, a lower contact having a base portion and a pair of mating beams extending vertically from the base portion for a length respectively and for engaging with the lower mating end of the upper contact, and a spring located between the upper contact and the lower contact. A channel is defined between the mating beams and providing a space to allow movement of the lower mating end. The pair of mating end has unequal lengths for providing unequal torque on the lower mating end, thus ensuring reliable electrical connection between the upper contact and lower contact even under worse circumstance.

13 Claims, 3 Drawing Sheets

COMPOSITE CONTACT ASSEMBLY HAVING LOWER CONTACT WITH CONTACT ENGAGING POINTS OFFSET FROM EACH OTHER

BACKGROUND OF THE INVENTION

1. Field of the Invention

The present invention relates to an electrical contact assembly, and more particularly, to a composite contact assembly having lower contact with contact engaging points offset from each other thus establishing reliable electrical connection between the lower contact and a mating upper contact.

2. Description of the Prior Art

Burn-in Socket is widely used for testing an IC package, so as to detect performance of the IC package and distinguish defective IC packages. A typical Burn-in Socket generally comprises an insulative housing having a number of electrical contact assemblies received therein. The electrical contact assembly generally comprises an upper contact, a lower contact and a spring between the upper contact and the lower contact. The upper contact comprises a flat base portion with a first contact portion at the top end. The lower contact comprises a flat body portion and a pair of arm portions extending upwardly from the body portion. The bottom end of the body portion has a second contact portion. The base portion is sandwiched between arms and the arms can move along the base portion.

When the CPU presses the upper contact, the upper contact moves downwardly and presses the spring, the arms moves along the base portion of the upper contact and contacts with the base portion all along. When the CPU is removed, the elastic force of the spring will push the upper contact moved upwardly to the initial stage.

The pair of arm portions each has a contacting point for engaging with the base portion and will exert a retaining force on the base portion. The pair of arm portions has equal length such that provides equal torque on the upper contact. Thus, electrical connection between the upper contact and the lower contact will be established. In order to ensure the arm portions moving along the base portion freely, said retaining force is needed to be controlled in a predetermined range. However, the retaining force will be reduced if the contact assembly is used in some worse application and the electrical connection between the upper contact and lower contact will be affected.

In view of the above, a new electrical contact that overcomes the above-mentioned disadvantages is desired.

SUMMARY OF THE INVENTION

Accordingly, an object of the present invention is to provide an electrical contact assembly having improved arrangements between an upper contact and a lower contact thereof; so as to ensure reliable electrical connection between the lower contact and a mating upper contact.

To fulfill the above-mentioned object, an electrical contact assembly comprises an upper contact having a lower mating end at a lower end thereof, a lower contact having a base portion and a pair of mating beams extending vertically from the base portion respectively and for engaging with the lower mating end of the upper contact, and a spring located between the upper contact and the lower contact. A channel is defined between the mating beams and providing a space to allow movement of the lower mating end. The pair of mating ends has unequal lengths for providing unequal torque on the lower mating end, thus ensuring reliable electrical connection between the upper contact and lower contact even under worse circumstance.

Other objects, advantages and novel features of the invention will become more apparent from the following detailed description when taken in conjunction with the accompanying drawings.

DETAILED DESCRIPTION OF THE PREFERRED EMBODIMENT OF THE INVENTION

Reference will now be made to the drawings to describe the present invention in detail.

Figure 1:
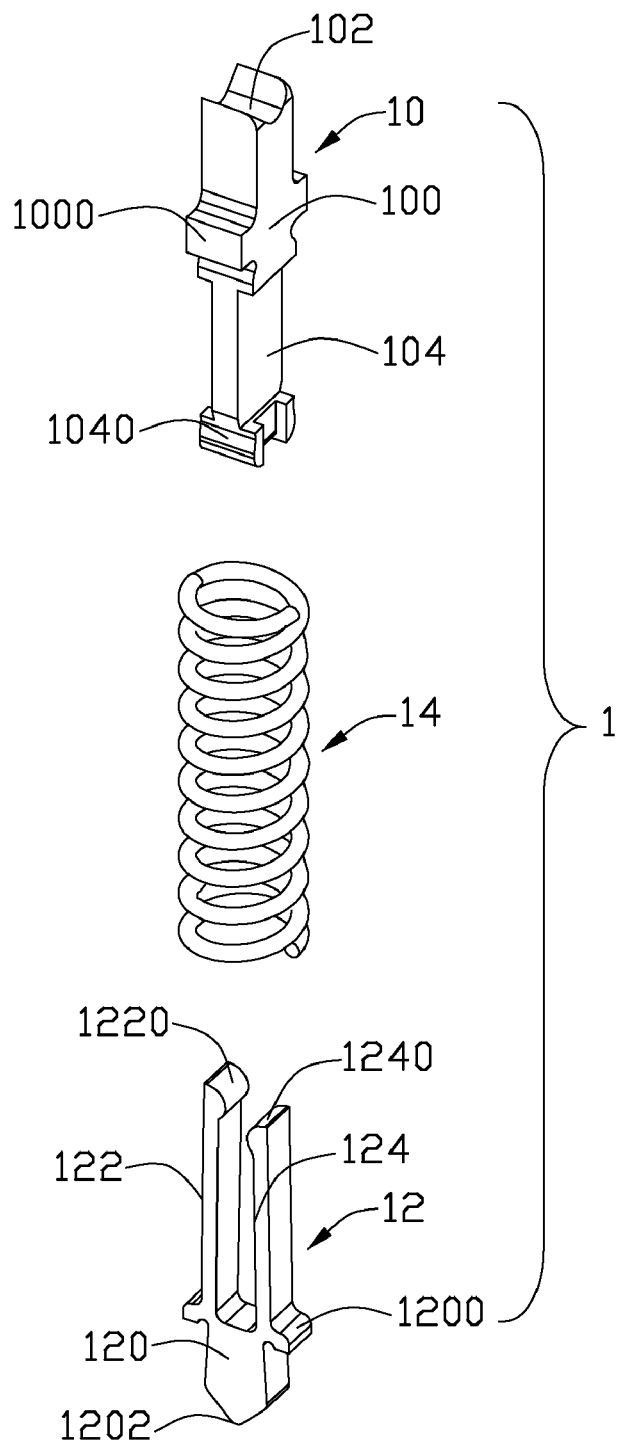
FIG. 1 is an exploded view of an electrical contact assembly in accordance with a preferred embodiment of the present invention.
Figure 2:
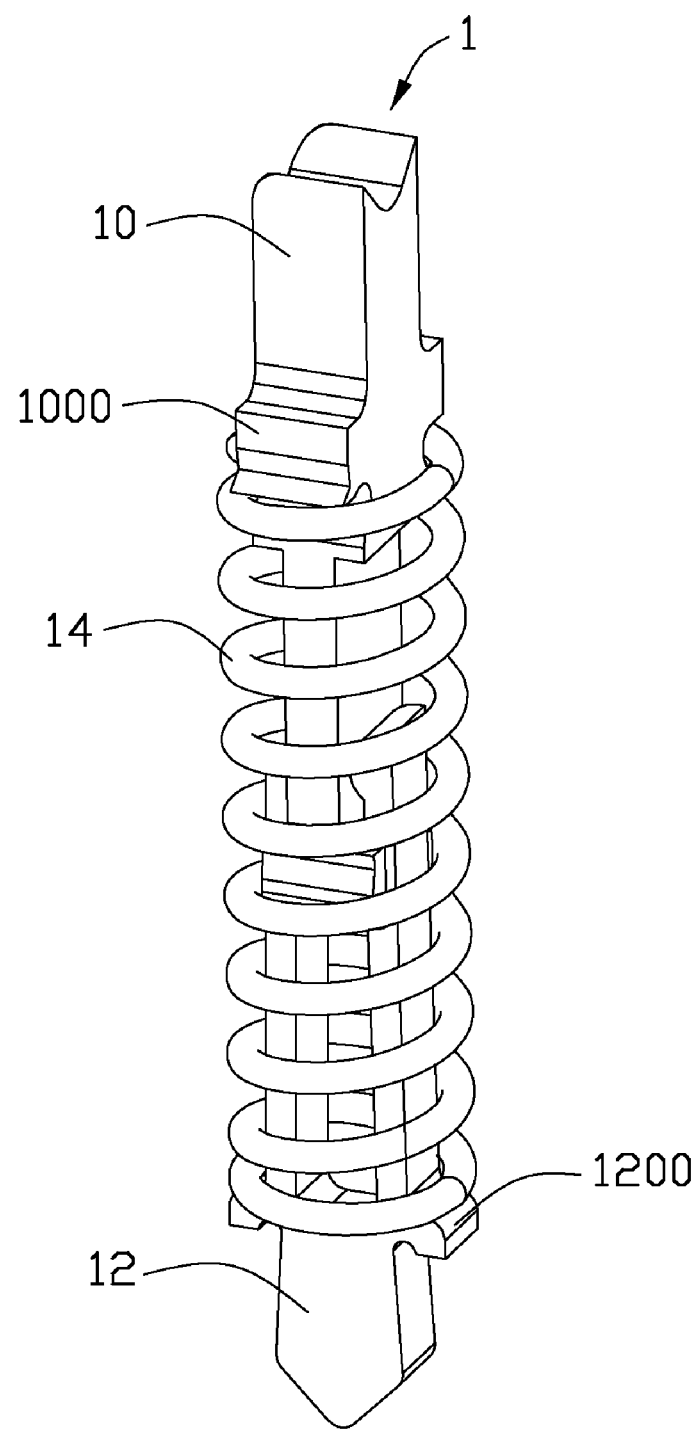
FIG. 2 is an assembled view of the electrical contact assembly shown in FIG. 1.
Figure 3:
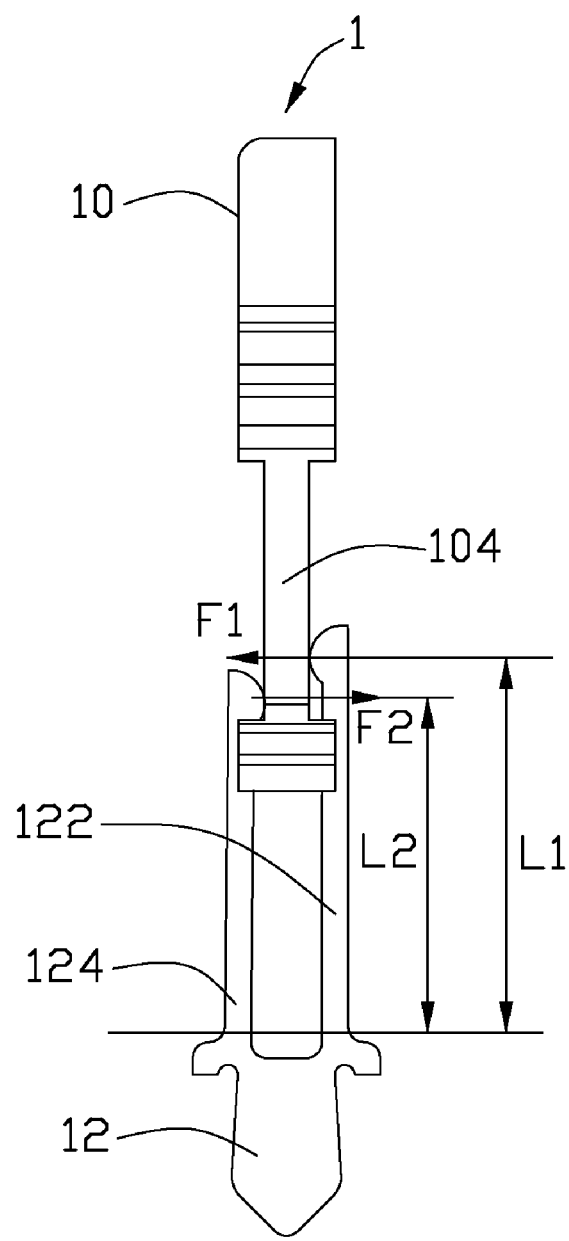
FIG. 3 is a side view of the electrical contact assembly shown in FIG. 2.

Referring to FIGS. 1-3, the electrical contact assembly 1 is used to electrically connecting a Central Processing Unit (CPU) (not shown) with a Printed Circuit Board (PCB) (not shown). The electrical contact assembly 1 comprises an upper contact 10, a lower contact 12 and a spring 14 located between the upper contact 10 and the lower contact 12.

The upper contact 10 comprises a main body 100, a first contacting portion 102 extending upwardly from a top end of the main body 100 for engaging with the CPU, and a lower mating end 104 extending downwardly from a lower end of the main body 100. The main body 100 defines a pair of first keeping portion 1000 at opposite edges thereof for positioning the spring 14 jointly with a second keeping portion 1200 formed on the lower contact 12. The lower mating end 104 defines a pair of hooks 1040 formed on opposite edges thereof. The hooks 1040 are received in channel defined between two mating beams 122, 124 of the lower contact, for prevent the upper contact 10 from slipping out from the lower contact 12.

The lower contact 12 comprises a base portion 120 and a pair of mating beams 122, 124 extending upwardly from opposite ends of a top portion of the base portion 120 and provided to be symmetrical with respect to each other. The mating beams 122, 124 extending from the base portion 120 for a length "L1", "L2", respectively. Value of the "L1" is greater than that of the "L2". A channel is defined by the two mating beams 122, 124. The mating beam 122 defines a projecting portion 1220 toward a centerline in vertical direction of the channel on a free end thereof. The mating beam 124 defines a projecting portion 1240 toward the centerline in vertical direction of the channel on a free end thereof. Accordingly, distance between the projecting portion 1220 and the base portion 120 is greater than distance between projecting portion 1240 and the base portion 120. The two projecting portion 1220, 1240 are used for engaging with the lower mating end 104. The base portion 120 defines two second keeping portions 1200 at opposite edges thereof. A second contacting portion 1202 extends downwardly from a bottom end of the base portion 120 for engaging with the PCB.

Please referring to FIG. 2, in an assembled process, the lower mating end 104 of the upper contact 10 is inserted into the channel of the lower contact 102. The spring 14 is positioned in a predetermined region by the first keeping portion 1000 and the second keeping portion 1200. The lower mating end 104 is moveable in the channel of the lower contact 12. The hooks 1040 will prevent the upper contact 10 from slipping out from the lower contact 12 jointly with the projecting portions 1220, 1240.

Please referring to FIG. 3, when the upper contact 10 engages with the lower contact 12, the mating beams 122, 124 will exert a retaining force F1-F2 via the projecting portions 1220, 1240. Because distance between the projecting portion 1220 and the base portion 120 is greater than distance between projecting portion 1240 and the base portion 120, the mating beam 122 will act a torque on the lower mating end 104 greater than a torque exerted on the lower mating end 104 by mating beam 124. Accordingly, the upper contact 12 will lean along a clockwise direction due to the two torque being unequal to each other, thus making the retaining force F2 greater. Thus, engaging effect between the upper contact 10 and lower contact 12 will be improved. Accordingly, reliable electrical connection is ensured between the upper contact 10 and lower contact 12 even under worse circumstances.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical contact assembly comprising:
   an upper contact comprising a lower mating end at a lower end thereof;
   a lower contact comprising a base portion, a pair of mating beams extending vertically from the base portion respectively and for engaging with the lower mating end of the upper contact, and a channel defined between the mating beams and providing a space to allow movement of the lower mating end; and
   a spring located between the upper contact and the lower contact;
   wherein each mating beam defines a contacting end for engaging with the lower mating end, the two contacting ends being offset from each other; wherein the pair of mating beams has unequal lengths.

2. The electrical contact assembly as claimed in claim 1, wherein the upper contact comprises a main body, the lower mating end extending downwardly from a lower end of the main body.

3. The electrical contact assembly as claimed in claim 2, wherein the upper contact defines a first contacting portion extending upwardly from a top end of the main body.

4. The electrical contact assembly as claimed in claim 1, wherein the two mating beams extend upwardly from opposite ends of a top portion of the base portion.

5. The electrical contact assembly as claimed in claim 4, wherein a second contacting portion extends downwardly from a bottom end of the base portion.

6. The electrical contact assembly as claimed in claim 1, wherein the contacting end is a projecting portion arranged on the mating beam toward a centerline in vertical direction of the channel, distance between one of the projecting portions and the base portion being unequal to distance between the other projecting portion and the base portion.

7. The electrical contact assembly as claimed in claim 6, wherein the lower mating end defines a pair of hooks formed on opposite edges thereof and received in the channel, for prevent the upper contact slipping out from the lower contact.

8. An electrical contact assembly comprising:
   an upper contact comprising a main body with a first contact portion at a top end thereof and a lower mating end at a bottom end thereof;
   a lower contact comprising a base portion and a pair of arms extending from the base portion, the base portion having a second contact portion at a bottom end thereof, the pair of arms defined a channel therebetween allowing movement of the lower mating end; and
   a spring located between the upper contact and the lower contact;
   wherein the pair of arms engage with the lower mating end and provide unequal torque on the lower mating end, so as to ensure reliable electrical connection between the upper contact and the lower contact even under condition that the upper contact is leant in worse circumstance; wherein the pair of arms each defines a projecting portion toward a centerline in vertical direction of the channel, distance between one of the projecting portions and the base portion being unequal to distance between the other projecting portion and the base portion.

9. The electrical contact assembly as claimed in claim 8, wherein the two arms extend upwardly from opposite ends of a top portion of the base portion.

10. The electrical contact as claimed in claim 8, wherein the lower mating end defines a pair of hooks formed on opposite edges thereof and received in the channel, for preventing the upper contact slipping out from the lower contact.

11. An electrical contact assembly comprising:
    a first contact defining a first main body with a first external contacting end for mechanically and electrically connecting to a first part, and a first internal contacting end; and
    a second contact moveable relative to the first contact in a vertical direction and defining a second main body with a second external contacting end for mechanically and electrically connecting to a second part, and a second internal contacting end; wherein
    the second contact includes a pair of mating beams around the second internal end to cooperate with each other for sandwich the first main body around the first internal end of the first contact therebetween under condition that the pair of mating beams apply unbalanced bending moments upon the first end of the first contact to increase corresponding forces upon the first contact; wherein a contact point of one of the mating beams is offset from that of the other of the mating beams in said vertical direction.

12. The electrical contact assembly as claimed in claim 11, wherein the first end defines a pair of groove structures to receive the corresponding mating beams therein for guiding the mating beams to move along the first main body in the vertical direction.

13. The electrical contact assembly as claimed in claim 11, wherein a pair of step structures are formed around the first end to confront projecting portions formed on free ends of the corresponding mating beams for restrict movement of the mating beam relative to the first main body in the vertical direction.

* * * * *